United States Patent
Sharifi Tehrani

(10) Patent No.: US 11,545,229 B1
(45) Date of Patent: Jan. 3, 2023

(54) PROBABILISTIC DATA INTEGRITY SCAN WITH DYNAMIC SCAN FREQUENCY

(71) Applicant: Micron Technology, Inc., Boise, ID (US)

(72) Inventor: Saeed Sharifi Tehrani, San Diego, CA (US)

(73) Assignee: MICRON TECHNOLOGY, INC., Boise, ID (US)

( * ) Notice: Subject to any disclaimer, the term of this patent is extended or adjusted under 35 U.S.C. 154(b) by 0 days.

(21) Appl. No.: 17/397,838

(22) Filed: Aug. 9, 2021

(51) Int. Cl.
G11C 29/32 (2006.01)
G11C 29/50 (2006.01)
G11C 29/44 (2006.01)
G11C 29/42 (2006.01)

(52) U.S. Cl.
CPC .............. G11C 29/32 (2013.01); G11C 29/42 (2013.01); G11C 29/4401 (2013.01); G11C 29/50004 (2013.01)

(58) Field of Classification Search
CPC ..... G11C 29/32; G11C 29/42; G11C 29/4401; G11C 29/50004
USPC .............................................. 365/189.05, 201
See application file for complete search history.

(56) References Cited

U.S. PATENT DOCUMENTS

| | | | |
|---|---|---|---|
| 9,509,621 B2 | 11/2016 | Gulati et al. | |
| 9,513,982 B1 | 12/2016 | Wu et al. | |
| 9,640,242 B1 | 5/2017 | Lo et al. | |
| 2010/0142281 A1* | 6/2010 | Yoo | G11C 11/5628 365/185.18 |
| 2010/0265764 A1* | 10/2010 | Yoo | G11C 16/10 365/185.02 |
| 2012/0060058 A1* | 3/2012 | Prakash | G11C 29/10 714/E11.169 |
| 2014/0301498 A1* | 10/2014 | Rimini | H04B 1/12 375/285 |
| 2018/0129612 A1 | 5/2018 | Lewis et al. | |

(Continued)

FOREIGN PATENT DOCUMENTS

KR 10-2020-0036508 A 4/2020
WO 94/19748 A2 9/1994

OTHER PUBLICATIONS

Non-Final Office Action, U.S. Appl. No. 17/397,789, dated Jun. 24, 2022, 8 pages.

(Continued)

*Primary Examiner* — Michael T Tran
(74) *Attorney, Agent, or Firm* — Nicholson De Vos Webster & Elliott LLP

(57) ABSTRACT

Exemplary methods, apparatuses, and systems include receiving a plurality of read operations. The read operations are divided into a current set of a sequence of read operations and one or more other sets. The size of the current set is a first number of read operations. An aggressor read operation is selected from the current set. A first data integrity scan is performed on a victim of the aggressor and a first indicator of data integrity is determined based on the first data integrity scan. In response to determining the first indicator of data integrity is greater than a current maximum value, the current maximum value is set to the first indicator of data integrity. In response to determining the current maximum value satisfies a threshold value, a size of a subsequent set of read operations is set to a second number, which less than the first number.

20 Claims, 6 Drawing Sheets

(56) References Cited

U.S. PATENT DOCUMENTS

| | | |
|---|---|---|
| 2018/0182465 A1 | 6/2018 | Alhussien et al. |
| 2020/0066342 A1 | 2/2020 | Ha |
| 2020/0104057 A1 | 4/2020 | Kim et al. |
| 2020/0104071 A1* | 4/2020 | Sallese ................. G06F 3/0658 |
| 2020/0104073 A1 | 4/2020 | Byun |
| 2021/0319834 A1* | 10/2021 | Sharifi Tehrani .. G11C 16/3422 |

OTHER PUBLICATIONS

International Search Report and Written Opinion, PCT App. No. PCT/US2022/037203, dated Oct. 25, 2022, 8 pages.

\* cited by examiner

PROBABILISTIC DATA INTEGRITY SCAN WITH DYNAMIC SCAN FREQUENCY

TECHNICAL FIELD

The present disclosure generally relates to the mitigation of read disturb errors in a memory subsystem, and more specifically, relates to determining and using a dynamic data integrity scan window for a probabilistic data integrity scan scheme.

BACKGROUND ART

A memory subsystem can include one or more memory devices that store data. The memory devices can be, for example, non-volatile memory devices and volatile memory devices. In general, a host system can utilize a memory subsystem to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Figure 1:
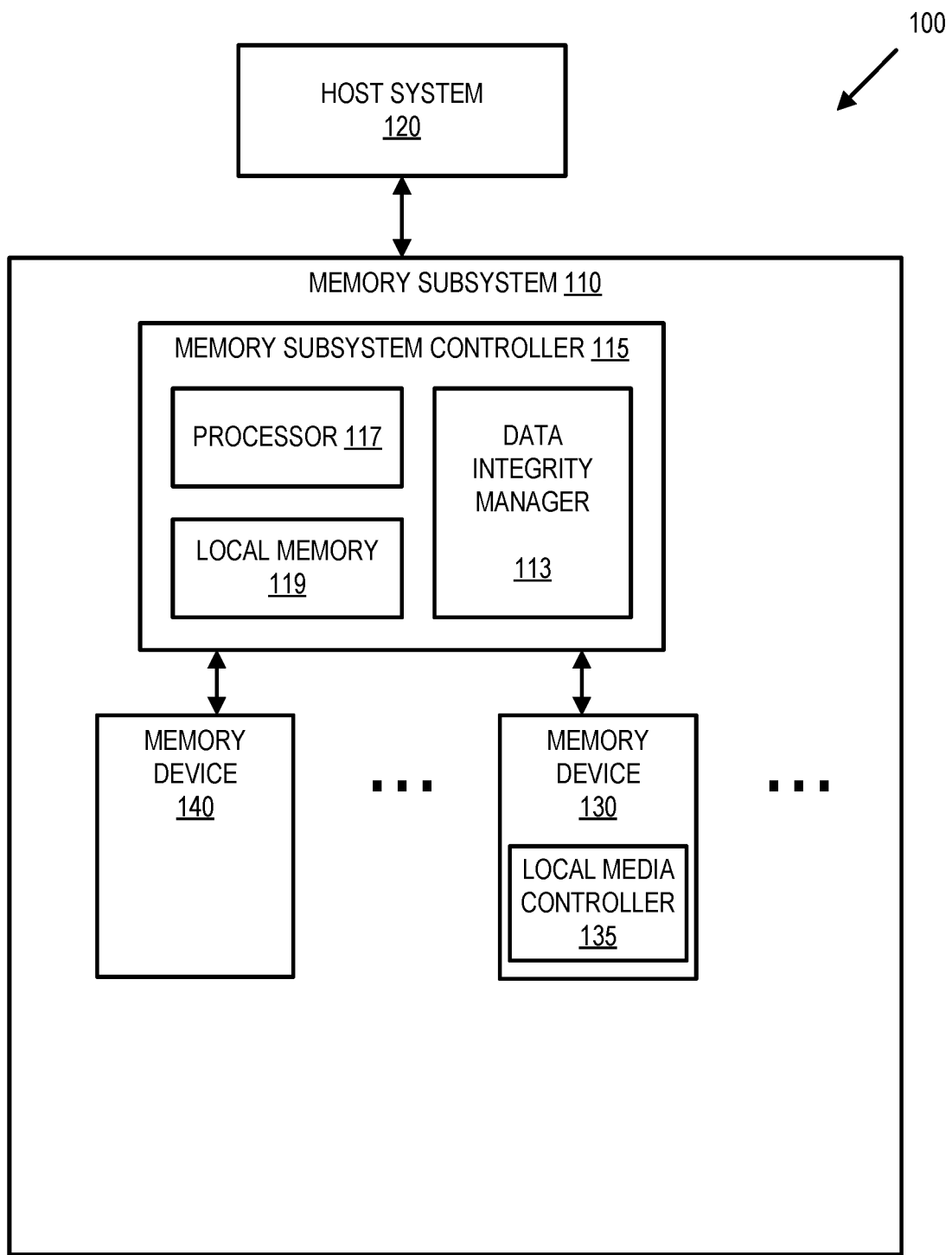
FIG. 1 illustrates an example computing system that includes a memory subsystem in accordance with some embodiments of the present disclosure.

Aspects of the present disclosure are directed to implementing a probabilistic data integrity scan scheme in a memory subsystem. A memory subsystem can be a storage device, a memory module, or a hybrid of a storage device and memory module. Examples of storage devices and memory modules are described below in conjunction with FIG. 1. In general, a host system can utilize a memory subsystem that includes one or more components, such as memory devices that store data. The host system can provide data to be stored at the memory subsystem and can request data to be retrieved from the memory subsystem.

A memory device can be a non-volatile memory device. A non-volatile memory device is a package of one or more dice. One example of non-volatile memory devices is a negative-and (NAND) memory device. Other examples of non-volatile memory devices are described below in conjunction with FIG. 1. The dice in the packages can be assigned to one or more channels for communicating with a memory subsystem controller. Each die can consist of one or more planes. Planes can be grouped into logic units (LUN). For some types of non-volatile memory devices (e.g., NAND memory devices), each plane consists of a set of physical blocks, which are groups of memory cells to store data. A cell is an electronic circuit that stores information.

Depending on the cell type, a cell can store one or more bits of binary information, and has various logic states that correlate to the number of bits being stored. The logic states can be represented by binary values, such as "0" and "1", or combinations of such values. There are various types of cells, such as single-level cells (SLCs), multi-level cells (MLCs), triple-level cells (TLCs), and quad-level cells (QLCs). For example, a SLC can store one bit of information and has two logic states.

Data reliability in a memory can degrade as the memory device increases in density (e.g., device components scale down in size, when multiple bits are programmed per cell, etc.). One contributor to this reduction in reliability is read disturb. Read disturb occurs when a read operation performed on one portion of the memory (e.g., a row of cells), often referred to as the aggressor, impacts the threshold voltages in another portion of memory (e.g., a neighboring row of cells), often referred to as the victim. Memory devices typically have a finite tolerance for these disturbances. A sufficient amount of read disturb effects, such as a threshold number of read operations performed on neighboring aggressor cells, can change the victim cells in the other/unread portion of memory to different logical states than originally programmed, which results in errors.

A memory system can track read disturb by using counters per subdivision of memory and reprogramming a given subdivision of memory when the counter reaches a threshold value. A probabilistic data integrity scheme consumes less storage by counting or otherwise tracking sets of read operations in a portion of memory (e.g., a die, logical unit, etc.) and performing a limited data integrity scan by checking the error rate of one or more read disturb victims of a randomly selected read operation in each set (also referred to as window). When the set or window size is set to a fixed value based on the worst-case scenario of memory reliability, however, the probabilistic data integrity scheme data integrity scans more often than needed for portions of memory with reliability metrics that are better than the worst-case scenario. For example, a probabilistic data integrity scan based on a worst-case scenario of memory reliability can result a drop in bandwidth (when compared to using read disturb counters) due to scanning portions of memory more often than needed because not all portions of memory perform at worst-case scenario levels of reliability.

Aspects of the present disclosure address the above and other deficiencies by dynamically selecting the scan frequency for each portion of memory based upon the reliability of that portion of memory. A greater scan frequency correlates to a smaller probabilistic data integrity scan window size while a lesser scan frequency correlates to a larger probabilistic data integrity scan window size. For example, the window size can be selected based upon an error rate or other reliability metric for the portion of memory. As a result, a probabilistic data integrity scheme can initiate data integrity scans based upon actual measures of reliability—reducing the frequency of scans and increasing bandwidth of portions of memory with good reliability and without sacrificing reliability coverage for those portions of memory that represent the worst-case scenario.

FIG. 1 illustrates an example computing system 100 that includes a memory subsystem 110 in accordance with some embodiments of the present disclosure. The memory subsystem 110 can include media, such as one or more volatile memory devices (e.g., memory device 140), one or more non-volatile memory devices (e.g., memory device 130), or a combination of such.

A memory subsystem 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory subsystems 110. In some embodiments, the host system 120 is coupled to different types of memory subsystems 110. FIG. 1 illustrates one example of a host system 120 coupled to one memory subsystem 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory subsystem 110, for example, to write data to the memory subsystem 110 and read data from the memory subsystem 110.

The host system 120 can be coupled to the memory subsystem 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), Small Computer System Interface (SCSI), a double data rate (DDR) memory bus, a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), or any other interface. The physical host interface can be used to transmit data between the host system 120 and the memory subsystem 110. The host system 120 can further utilize an NVM Express (NVMe) interface to access components (e.g., memory devices 130) when the memory subsystem 110 is coupled with the host system 120 by the PCIe interface. The physical host interface can provide an interface for passing control, address, data, and other signals between the memory subsystem 110 and the host system 120. FIG. 1 illustrates a memory subsystem 110 as an example. In general, the host system 120 can access multiple memory subsystems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Although non-volatile memory devices such as NAND type memory (e.g., 2D NAND, 3D NAND) and 3D cross-point array of non-volatile memory cells are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM)

A memory subsystem controller 115 (or controller 115 for simplicity) can communicate with the memory devices 130 to perform operations such as reading data, writing data, or erasing data at the memory devices 130 and other such operations (e.g., in response to commands scheduled on a command bus by controller 115). The memory subsystem controller 115 can include hardware such as one or more integrated circuits and/or discrete components, a buffer memory, or a combination thereof. The hardware can include digital circuitry with dedicated (i.e., hard-coded) logic to perform the operations described herein. The memory subsystem controller 115 can be a microcontroller, special purpose logic circuitry (e.g., a field programmable gate array (FPGA), an application specific integrated circuit (ASIC), etc.), or another suitable processor.

The memory subsystem controller 115 can include a processing device 117 (processor) configured to execute instructions stored in a local memory 119. In the illustrated example, the local memory 119 of the memory subsystem controller 115 includes an embedded memory configured to store instructions for performing various processes, operations, logic flows, and routines that control operation of the memory subsystem 110, including handling communications between the memory subsystem 110 and the host system 120.

In some embodiments, the local memory 119 can include memory registers storing memory pointers, fetched data, etc. The local memory 119 can also include read-only memory (ROM) for storing micro-code. While the example memory subsystem 110 in FIG. 1 has been illustrated as including the memory subsystem controller 115, in another embodiment of the present disclosure, a memory subsystem 110 does not include a memory subsystem controller 115, and can instead rely upon external control (e.g., provided by an external host, or by a processor or controller separate from the memory subsystem 110).

In general, the memory subsystem controller 115 can receive commands or operations from the host system 120 and can convert the commands or operations into instructions or appropriate commands to achieve the desired access to the memory devices 130 and/or the memory device 140. The memory subsystem controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory subsystem controller 115 can further include host interface circuitry to communicate with the host system 120 via the physical host interface. The host interface circuitry can convert the commands received from the host system into command instructions to access the memory devices 130 and/or the memory device 140 as well as convert responses associated with the memory devices 130 and/or the memory device 140 into information for the host system 120.

The memory subsystem 110 can also include additional circuitry or components that are not illustrated. In some embodiments, the memory subsystem 110 can include a cache or buffer (e.g., DRAM) and address circuitry (e.g., a row decoder and a column decoder) that can receive an address from the memory subsystem controller 115 and decode the address to access the memory devices 130.

In some embodiments, the memory devices 130 include local media controllers 135 that operate in conjunction with memory subsystem controller 115 to execute operations on one or more memory cells of the memory devices 130. An external controller (e.g., memory subsystem controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory subsystem 110 includes a data integrity manager 113 that mitigates read disturb and other data errors. In some embodiments, the controller 115 includes at least a portion of the data integrity manager 113. For example, the controller 115 can include a processor 117 (processing device) configured to execute instructions stored in local memory 119 for performing the operations described herein. In some embodiments, a data integrity manager 113 is part of the host system 120, an application, or an operating system.

The data integrity manager 113 can implement and manage a read disturb mitigation scheme. For example, the data integrity manager 113 can implement a dynamic data integrity scan frequency for a probabilistic data integrity scan scheme. Further details with regards to the operations of the data integrity manager 113 are described below.

Figure 2:
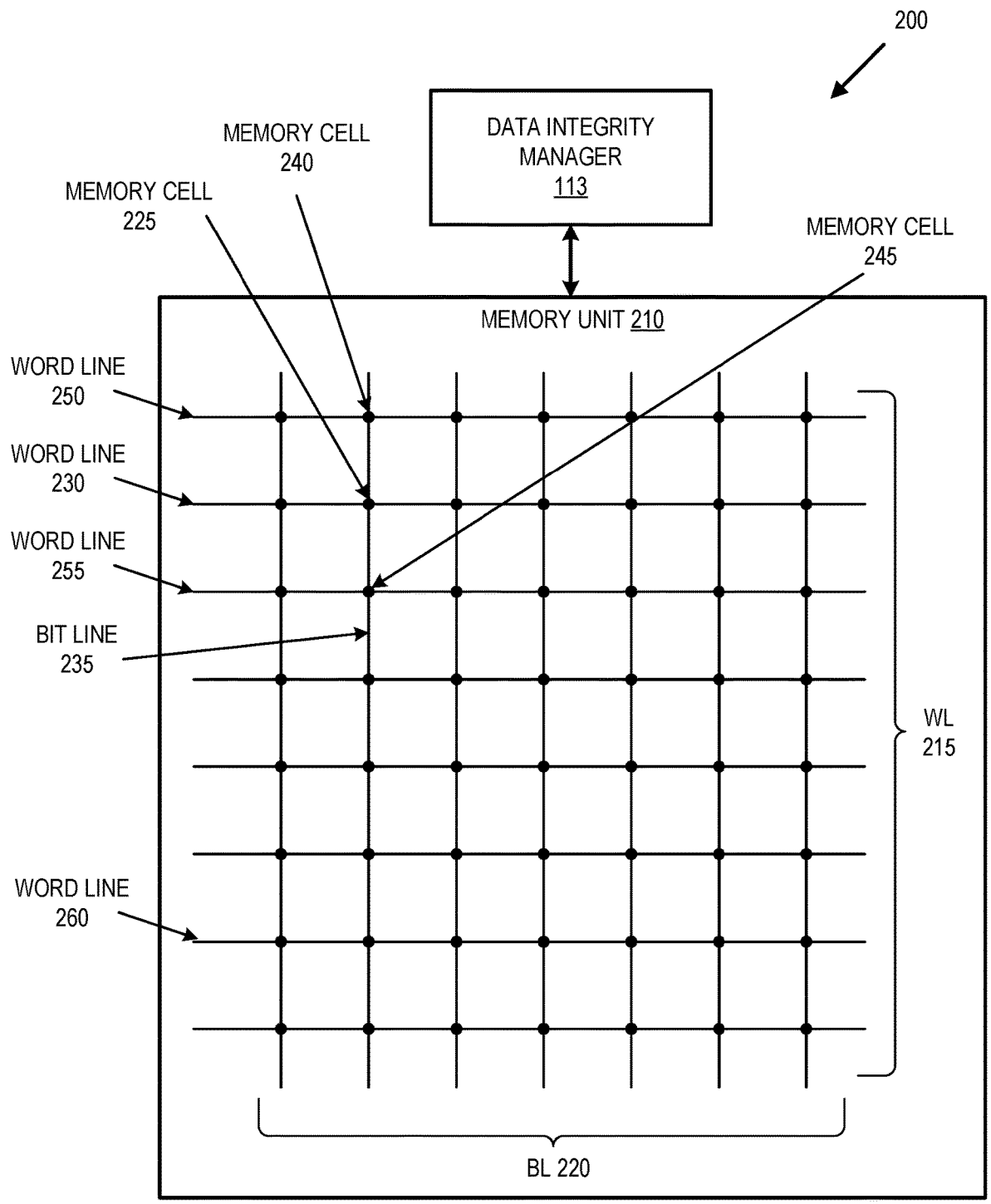
FIG. 2 illustrates an example of managing a portion of a memory subsystem in accordance with some embodiments of the present disclosure.

FIG. 2 illustrates an example of managing a portion of a memory subsystem 200 in accordance with some embodiments of the present disclosure. In one embodiment, the data integrity manager 113 implements a read disturb mitigation scheme per memory unit 210. For example, the data integrity manager 113 can perform a separate probabilistic read disturb mitigation scheme per LUN.

The illustration of the memory unit 210 includes an array of memory cells. The memory 210 illustrates a small number of memory cells for the sake of providing a simple explanation. Embodiments of the memory unit 210 can include far greater numbers of memory cells.

Each memory unit 210 includes memory cells that the memory subsystem 110 accesses via word lines 215 and bit lines 220. For example, a memory device 130 can read a page of memory using word line 230. Within that page, memory cell 225 is accessed via word line 230 and bit line 235. As described above, reading a memory cell can result in read disturb effects on other memory cells. For example, a read of memory cell 225 (the aggressor) can result disturbing memory cells 240 and 245 (the victims). Similarly, a read of other memory cells of word line 230 (the aggressor) can result in disturbing other memory cells of word lines 250 and 255 (the victims).

This disturb effect can increase the error rate for victim memory cells. In one embodiment, the data integrity manager 113 measures the error rate of a portion of memory as a raw bit error rate (RBER). In another embodiment, the data integrity manager 113 can use other measurements to represent an error rate or data reliability, such as voltage distribution values (e.g., a read threshold voltage distribution). In one embodiment, the data integrity manager 113 compares current, recent, or average voltage distribution values to ideal or expected voltage distribution values (e.g., values that result from a new or stress-free memory) and the magnitude of difference represents the error rate or other indication of data reliability. The data integrity manager 113 can track and mitigate read disturb by tracking read operation traffic in the memory unit 210 and checking the error rate of victim(s). For example, the data integrity manager 113 can select a read operation directed to word line 230 as the aggressor for testing read disturb and perform a read of word lines 250 and 255 to determine the error rate of each. In response to detecting an error rate of a given victim portion of memory satisfying a threshold error rate value, the data integrity manager 113 can migrate data from the victim portion of memory to different portion of memory.

In one embodiment, the data integrity manager 113 also maintains one or more indicators of data integrity (e.g., RBER or other data reliability values) performing data integrity scans. For example, the data integrity manager 113 can compare an RBER value of a current data integrity scan to one or more saved maximum RBER values and replace a saved value when the RBER value of the current data integrity scan exceeds the saved value. The data integrity manager 113 uses the saved representative data reliability value(s) to dynamically update the window size of the probabilistic read disturb handling scheme. This and other features of the probabilistic read disturb handling scheme is described further with reference to FIGS. 3-5.

Figure 3:
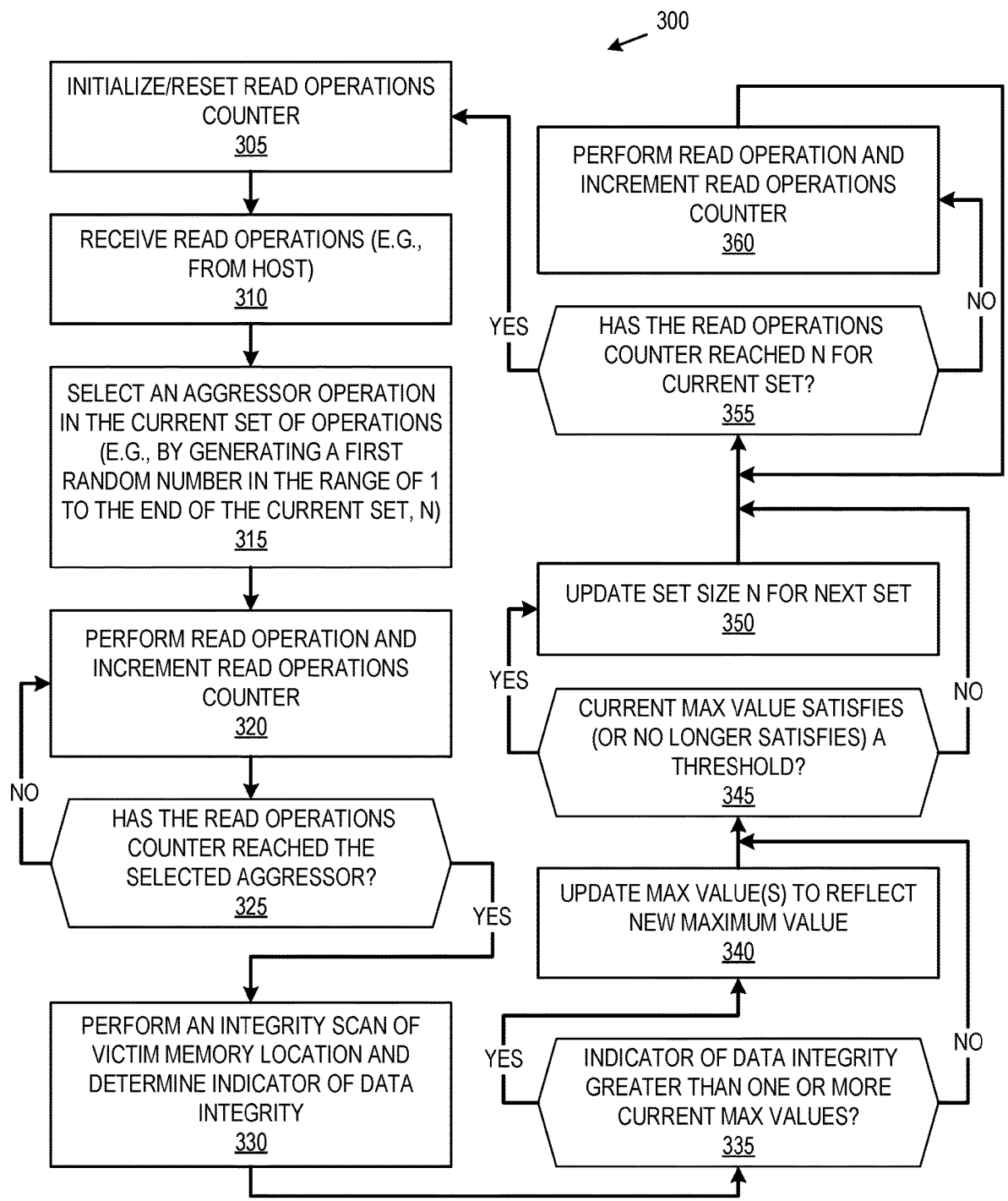
FIG. 3 is a flow diagram of an example method to implement a dynamic data integrity scan frequency for a probabilistic data integrity scan scheme in accordance with some embodiments of the present disclosure.

FIG. 3 is a flow diagram of an example method 300 to implement a dynamic data integrity scan frequency for a probabilistic data integrity scan scheme in accordance with some embodiments of the present disclosure. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300 is performed by the data integrity manager 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 305, the processing device initializes or resets a counter for tracking the processing of read operations. For example, the processing device can set the counter to zero to begin tracking the processing of read operations in a set of read operations. In one embodiment, the processing device processes operations in sets of sequences of read operations. For example, if a set includes 10,000 read operations, the counter is initialized or reset to a state that allows it to count at least 10,000 read operations. The number of operations per set is a dynamic value, however, and will referred to here as N.

At operation 310, the processing device receives read operation requests. Read requests can be received from one or more host systems and/or generated by another process within the memory subsystem 110. The processing device can receive read operation requests asynchronously, continuously, in batches, etc. In one embodiment, the memory subsystem 110 receives operation requests from one or more host systems 120 and stores those requests in a command queue. The processing device can process the read operations, from the command queue and/or as internally generated, in sets of N operations.

At operation 315, the processing device selects an aggressor operation in the current set of operations. When implementing a probabilistic read disturb handling scheme, the processing device can select an aggressor in the current set by generating a random number (e.g., a uniform random number) in the range of 1 to N and, when the count of read operations reaches the random number in the current set, identifying the current/last read operation as the aggressor.

At operation 320, the processing device performs a read operation. For example, the memory subsystem 110 reads a page of data by accessing the memory cells along a word line and returning the data to the host system 120 or internal process that initiated the read request. Additionally, the processing device increments the read operations counter. For example, the processing device can increment the counter in response to completing a read operation to track the current position in the sequence of read operations in the current set.

At operation 325, the processing device determines if the read operations counter has reached the aggressor operation in the set. For example, the processing device can compare the value of the counter to the first random number generated to identify the aggressor read operation in the current set. If the counter has not yet reached the position in the sequence corresponding to the aggressor operation, the method 300 returns to operation 320 to continue the performance of the next read operation, as described above. If the counter has reached the position in the sequence corresponding to the aggressor operation, the method 300 proceeds to operation 330.

At operation 330, the processing device performs an integrity scan of the victim(s) of the selected aggressor. For example, the processing device can execute a read of each victim to determine an indicator of data integrity of the victim. In one embodiment, this includes checking the error rate, such as a raw bit error rate (RBER), for the victim. In another embodiment, determining an indicator of data integrity of the victim includes comparing the threshold voltage distribution of the victim/sampled portion of memory with an expected voltage distribution. If the error rate of a victim memory location satisfies a fold threshold (e.g., meets or exceeds an error rate threshold value), the processing device folds the data by, e.g., error correcting the data of the victim memory location and writing the corrected data to a new location.

At operation 335, the processing device determines if the indicator of data integrity of the victim is greater than one or more current maximum worst values. For example, the processing device can maintain a highest maximum error rate value and a next-highest maximum error rate value for indicators of data integrity for a portion of memory. For another indicator of data integrity, however, the worst value may not be the maximum value. For example, when using threshold voltage distributions as indicators of data reliability, the processing device can compare the "shape" of measured distribution values/histogram against ideal values by determining if the shape is monotonically increasing/decreasing, compare local minima, comparing the width of histograms, determining an amount of shift (left/right) of histograms, etc. As another example, the processing device can compare the "population" of threshold voltage distributions/histograms or portions thereof (e.g., between certain read positions). A recent histogram population that satisfies a threshold increase from an ideal population between read positions can serve as an indication of data reliability (or lack thereof). As another example, the processing device can evaluate a margin compared to a threshold error correction limit—the lower the measured margin, the worse the data reliability. For simplicity of describing examples below, it should be understood that a maximum value can be used interchangeably with a worst value.

If the indicator of data integrity of the victim is greater than one or more current worst values, the method 300 proceeds to operation 340. If the indicator of data integrity of the victim is not greater than a current worst value, the method 300 proceeds to operation 345.

The processing device can maintain one or more worst values per various subdivisions of memory—e.g., per die/LUN, plane, independent word line segment, group of word lines, group of LUN's, block or group of blocks, etc. In one embodiment, the processing device determines an average or other combination of indicators to reflect the worst value for a subdivision of memory. For example, the processing device can determine an indicator of data integrity for each block of memory in a LUN and average or combine the indicators of data integrity as an indicator for the entire LUN. In one embodiment, based on the granularity is used, the processing device maintains a worst value per unique subdivision of that portion memory. For example, if a worst value is maintained per LUN, the processing device can maintain worst values per block of memory—the same block cannot provide both the worst value and the second-worst value.

At operation 340, the processing device updates one or more worst/maximum values to reflect a new worst/maximum value. For example, when the indicator of data integrity of the victim is greater than the current highest maximum value, the processing device demotes the current highest maximum value to become the new next-highest maximum value and sets the indicator of data integrity of the victim to be the new current highest maximum value. When the indicator of data integrity of the victim is greater than the next-highest maximum value (but not the highest maximum value), the processing device sets the indicator of data integrity of the victim to be the new next-highest maximum value (e.g., replacing the previous value). When an existing worst/maximum value is for the same block/subdivision of memory as the victim, the processing device replaces that worst/maximum value with the indicator of data integrity of the victim and, if applicable, can reorder the worst and second-worst values.

At operation 345, the processing device determines if the current worst/maximum value satisfies one or more threshold values. For example, the processing device can divide a range of data integrity values into sub-ranges by one or more threshold values and each sub-range can be associated with a different data integrity scan window size. The processing device determines if the current maximum value falls within one of the sub-ranges by the current maximum value exceeding, equaling, or falling below a given threshold value. The range of data integrity values can span from, e.g., an error rate of zero to the fold threshold value.

As a simple example, the range of data integrity values can be divided into two sub-ranges: a low range and a high range, the low range corresponding to a large data integrity scan window size and the high range corresponding to a small data integrity scan window size. The low range can be defined as including error rate values between zero and a dynamic window threshold and the high range can be defined as including error rate values between the dynamic window threshold and the fold threshold.

In one embodiment, a single dynamic window threshold value can divide the sub-ranges and a current maximum value that is less than this threshold value falls into the low range and a current maximum value that is greater than this threshold value falls into the high range. In another embodiment, two dynamic window threshold values can divide the sub-ranges and the threshold value used can depend on a current sub-range based on a previous maximum value. For example, when the previous maximum value fell into the low range a large threshold value can be used to trigger a move from the low range to the high range while a small threshold value can be used to trigger a move from the high range to the low range. As a result, the different threshold values can trigger changes in data integrity scan window size more conservatively.

In one embodiment, the processing device implements a dynamic window size that allows for the window size to shrink quickly but grow slowly. For example, the processing device can insert a delay (time, number of sets, etc.) prior to using an updated window size that is smaller than the current window size. This delay can allow for subsequent sets to alter the worst/maximum value and possibly cancel the decrease in window size. As a result, the processing device can avoid rapid fluctuations in window size. In one embodiment, the amount of delay inserted is a function of (1) the number of program/erase (P/E) cycles performed on the memory or portion of memory and/or (2) block type (SLC, MLC, TLC, etc.). For example, the greater the number of P/E cycles or greater the density of the block, the larger delay selected by the processing device.

If the current maximum value satisfies one or more dynamic window threshold values (e.g., that would lead the processing device to trigger a change in data integrity scan window size based on a current range of data integrity values), the method 300 proceeds to operation 350. If the current maximum value does not satisfy one or more threshold values (e.g., no change from the previous range of data integrity values), the method proceeds to operation 355.

At operation 350, the processing device updates the set size for the next set of operations. For example, in response to the current maximum value satisfying a threshold value and, thus, falling into a new range of data integrity values, the processing device changes the data integrity scan window size by updating the number of operations per set, N, starting with the next set or, if delayed, another subsequent set. The current set continues with the use of the current value of N while the processing device stores the updated of value of N (or delta) to be applied to the next set. As a result, the processing device can decrease the window size to scan more victims as the maximum value of data integrity indicators increases and increase the window size to scan fewer victims as the maximum value of data integrity indicators decreases. With the dynamic window size changes being bidirectional, embodiments can set an initial value of N (e.g., after a power cycle) to a small window size or to a large window size and allow subsequent sets to adjust the window size dynamically as needed. In one embodiment, the processing device stores a current value of N in non-volatile memory and that value of N is used following a power cycle.

At operation 355, the processing device determines if the read operations counter has reached the end of the current set. For example, the processing device can compare the value of the counter to the value of N for the current set. If the read operations counter has reached the end of the current set, the method 300 proceeds to operation 305 to reset the counter (e.g., to the value of N for the next set) and process the next set of read operations. If the read operations counter has not reached the end of the current set, the method 300 proceeds to operation 360.

At operation 360, the processing device performs a read operation and increments the read operations counter as described above with reference to operation 325. The method 300 proceeds to operation 355 to once again determine if the read operations counter has reached the end of the current set.

In one embodiment, the processing device deactivates the dynamic feature for the data integrity scan window in response to satisfying a threshold for the maximum value of the indicator of data integrity, satisfying a threshold for the maximum value of the indicator of data integrity a threshold number of times, satisfying a threshold number of program/erase cycles, etc. As a result, the processing device bypasses operations 335-350 in subsequent sets.

Figure 4:
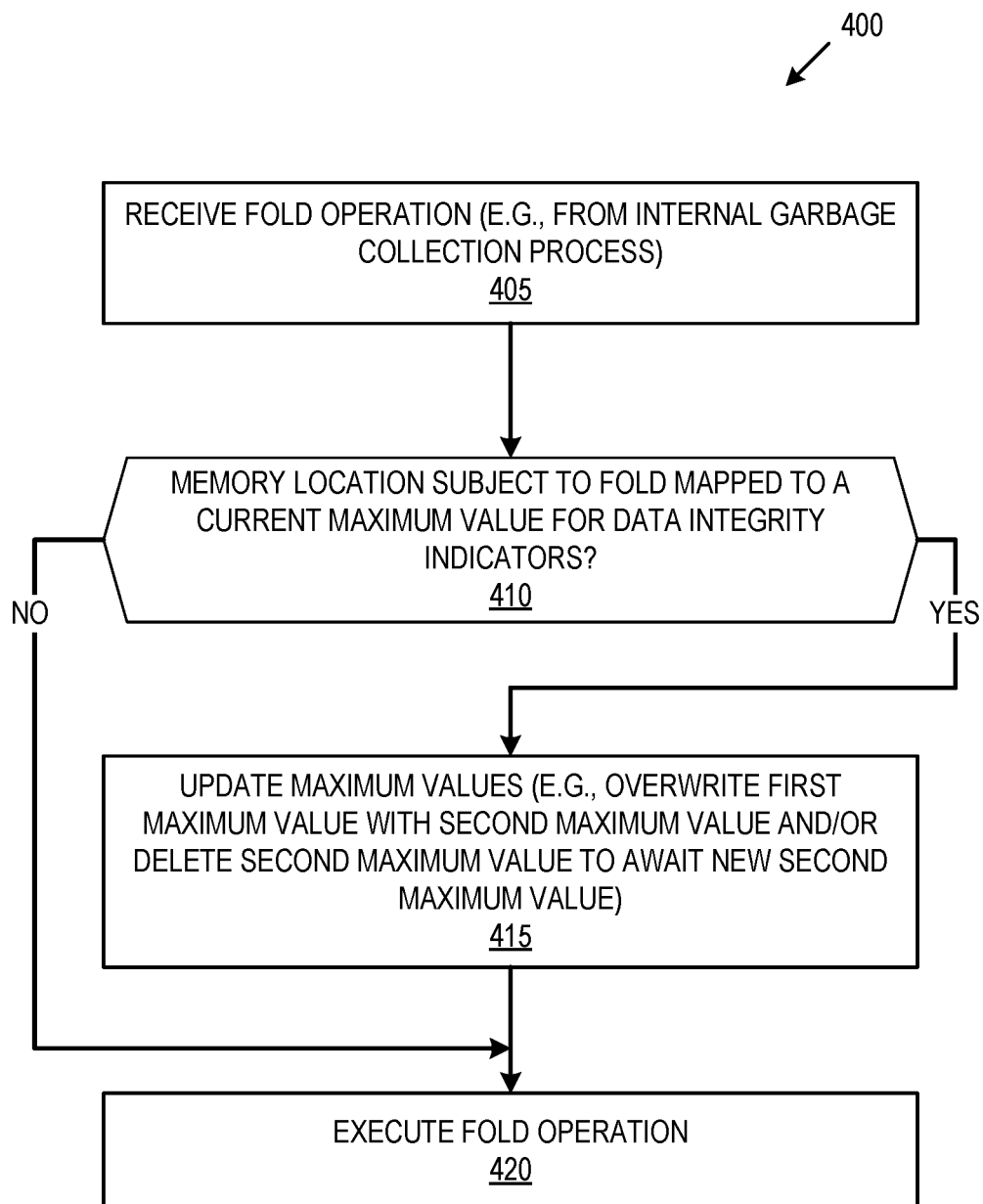
FIG. 4 is flow diagram of another example method to implement a dynamic data integrity scan frequency for a probabilistic data integrity scan scheme in accordance with some embodiments of the present disclosure.

FIG. 4 is flow diagram of another example method to implement a dynamic data integrity scan frequency for a probabilistic data integrity scan scheme in accordance with some embodiments of the present disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by the data integrity manager 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 405, the processing device receives a fold operation. For example, the processing device can receive a request or an operation to copy data to a new location in response to determining an indicator of data integrity satisfies the fold threshold or another internal garbage collection process.

At operation 410, the processing device determines if a memory location subject to the fold operation is mapped to a current worst/maximum value for data integrity indicators. For example, in addition to saving a maximum value as described above, the processing device can also save a mapping between the maximum value and an address or other identification of the memory location that was subject to the data integrity scan that determined the maximum value of data integrity indicators. If the memory location subject to the fold operation is mapped to a current maximum value for data integrity indicators, the method 400 proceeds to operation 415. If the memory location subject to the fold operation is not mapped to a current maximum value for data integrity indicators, the method 400 proceeds to operation 420.

At operation 415, the processing device updates the worst/maximum values in response to the fold operation. For example, if the fold operation maps to the highest maximum value, the processing device overwrites the highest maximum value with the second-worst/next-highest maximum value (promoting the next-highest value). In one embodiment, the processing device deletes the next-highest value, flags it as being in need of updating, or otherwise notes the promotion. As another example, if the fold operation maps to the next-highest maximum value, the processing device deletes the next-highest value, flags it as being in need of updating, or otherwise notes the next-highest value is no longer valid. In either scenario, the processing device can use a subsequent data integrity scan to add a second maximum value again as described above. While examples set forth above refer to two worst/maximum values, embodiments can maintain and use more than two worst/maximum values.

At operation 420, the processing device executes the fold operation. For example, the processing device reads data from a source location and writes the data to a target location. Such a fold operation can be used to reduce the likelihood of error in reading the data in the future, to free up a writeable unit of memory, etc.

Figure 5:
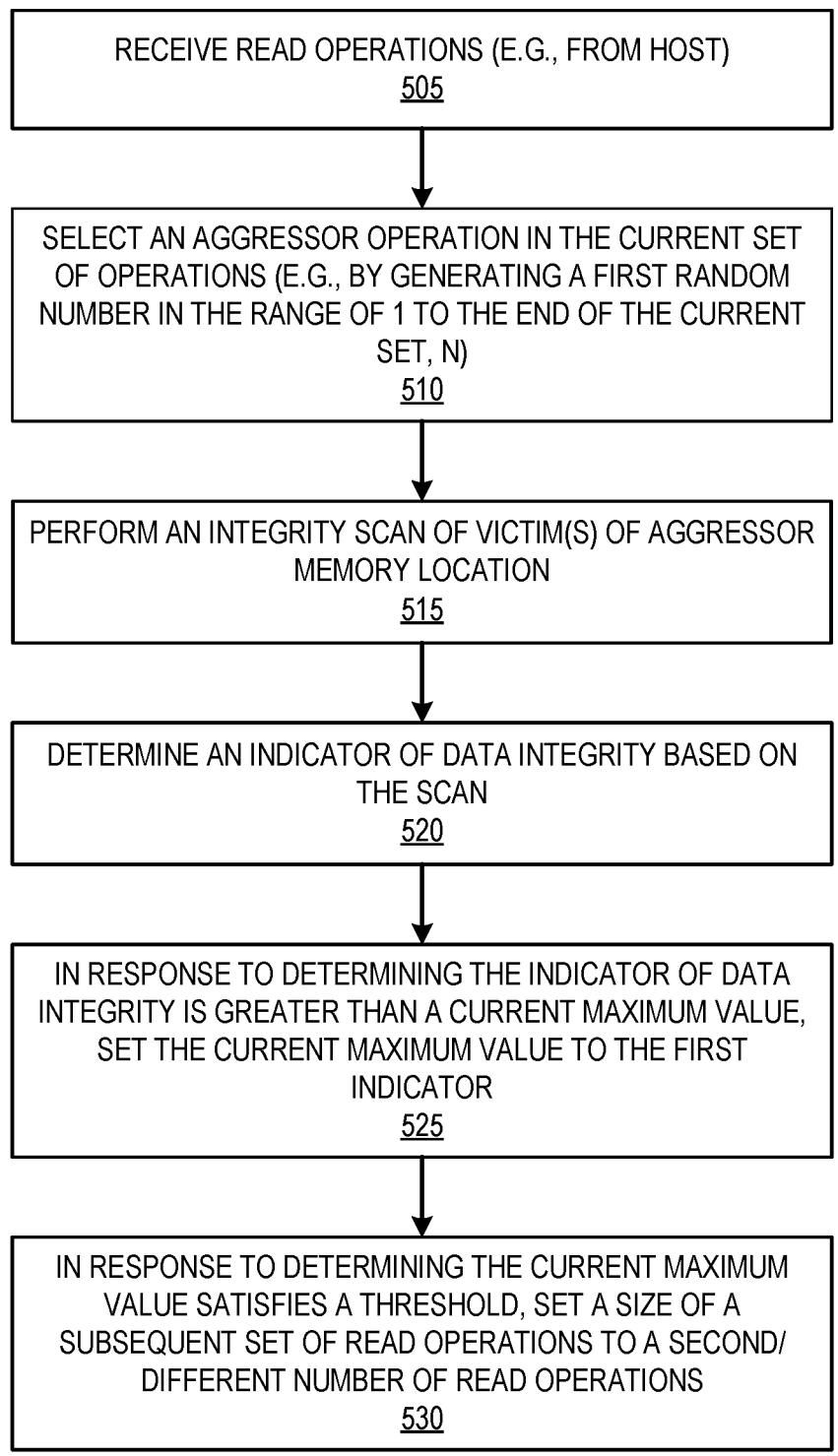
FIG. 5 is flow diagram of another example method to implement a dynamic data integrity scan frequency for a probabilistic data integrity scan scheme in accordance with some embodiments of the present disclosure.

FIG. 5 is flow diagram of another example method to implement a dynamic data integrity scan frequency for a probabilistic data integrity scan scheme in accordance with some embodiments of the present disclosure. The method 500 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 500 is performed by the data integrity manager 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 505, the processing device receives read operations, e.g., as described with reference to operation 310. The processing device divides the read operations into sets of read operations. For example, the processing device can use a counter to track a number, N, of operations to be performed per set.

At operation 510, the processing device selects an aggressor read operation in the current set of operations. For example, the processing device can randomly select a read operation in the current set to identify one or more victims to be the subject of a data integrity scan.

At operation 515, the processing device performs a data integrity scan of the victim memory location(s). For example, the processing device can execute a read of the victim(s) to check the error rate of each as described above with respect to operation 330.

At operation 520, determines an indicator of data integrity based on the scan. For example, the processing device determines the RBER or the threshold voltage distribution of the victim/sampled portion of memory as described above with respect to operation 330.

At operation 525, in response to determining the indicator of data integrity is greater than a current maximum value, the processing device updates the current maximum value to the indicator of the recent scan. For example, the processing device can update one or more maximum values as described above with respect to operation 340.

At operation 530, in response to determining the current maximum value satisfies a threshold, the processing device sets a size of a subsequent set of read operations to a second/different number of read operations. For example, the processing device can update the set size, N, for one or more subsequent sets as described above with respect to operation 350.

While the examples above focus on dynamically selecting the data integrity scan frequency based on worst data integrity values, other embodiments can dynamically adjust scan frequency based on number of P/E cycles or a similar indicator of data reliability. For example, the processing device can compare a current number of P/E cycles for a portion/subdivision of memory to one or more thresholds and update the scan frequency for different ranges of P/E cycles.

Figure 6:
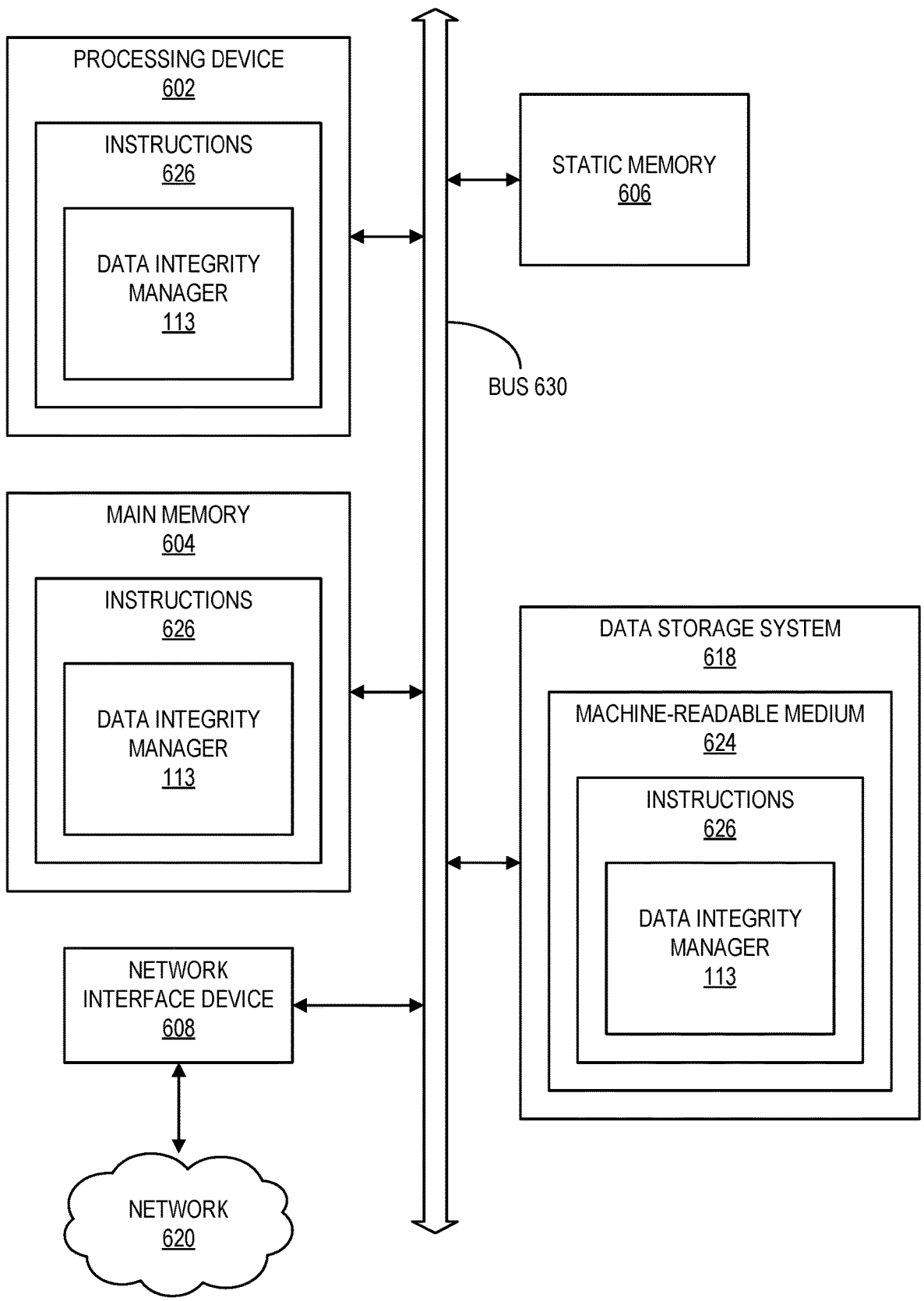
FIG. 6 is a block diagram of an example computer system in which embodiments of the present disclosure may operate.

FIG. 6 illustrates an example machine of a computer system 600 within which a set of instructions, for causing the machine to perform any one or more of the methodologies discussed herein, can be executed. In some embodiments, the computer system 600 can correspond to a host system (e.g., the host system 120 of FIG. 1) that includes, is coupled to, or utilizes a memory subsystem (e.g., the memory subsystem 110 of FIG. 1) or can be used to perform the operations of a controller (e.g., to execute an operating system to perform operations corresponding to the data integrity manager 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a data storage system 618, which communicate with each other via a bus 630.

Processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 608 to communicate over the network 620.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory subsystem 110 of FIG. 1.

In one embodiment, the instructions 626 include instructions to implement functionality corresponding to a data integrity manager (e.g., the data integrity manager 113 of FIG. 1). While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general-purpose computer selectively activated or reconfigured by a computer program stored in the computer. For example, a computer system or other data processing system, such as the controller 115, may carry out the computer-implemented methods 300-500 in response to its processor executing a computer program (e.g., a sequence of instructions) contained in a memory or other non-transitory machine-readable storage medium. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general-purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method comprising:
    receiving a plurality of read operations directed to a portion of memory, the plurality of read operations divided into a current set of a sequence of read operations and one or more other sets of sequences of read operations, a size of the current set being a first number of read operations;
    selecting a first aggressor read operation from the current set;
    performing a first data integrity scan on a victim of the first aggressor read operation;
    determining a first indicator of data integrity based on the first data integrity scan;
    in response to determining the first indicator of data integrity is greater than a current maximum value of indicators of data integrity for a subdivision of memory, setting the current maximum value to the first indicator of data integrity; and
    in response to determining the current maximum value satisfies a first threshold value, setting a size of a subsequent set of read operations to a second number of read operations, the second number being different than the first number.

2. The method of claim 1, wherein the second number is less than the first number.

3. The method of claim 1, wherein the first indicator of data integrity is a bit error rate.

4. The method of claim 1, wherein the first indicator of data integrity is a read threshold voltage distribution.

5. The method of claim 1, further comprising:
    selecting a second aggressor read operation from the subsequent set;
    performing a second data integrity scan on a victim of the second aggressor read operation from the subsequent set;
    determining a second indicator of data integrity based on the second data integrity scan; and
    in response to determining the second indicator of data integrity is greater than a second maximum value of indicators of data integrity for a subdivision of memory, setting the second maximum value to the second indicator of data integrity.

6. The method of claim 5, further comprising:
    in response to folding the victim of the first aggressor read operation, setting the current maximum value to the second maximum value; and
    in response to determining the current maximum value no longer satisfies the first threshold value, setting a size of a subsequent set of read operations to the first number of read operations.

7. The method of claim 1, further comprising:
    selecting an aggressor read operation from the subsequent set of operations having a set size of the second number;
    performing a second data integrity scan on a victim of the aggressor read operation from the subsequent set of operations;
    determining a second indicator of data integrity based on the second data integrity scan;
    in response to determining the second indicator of data integrity is greater than the current maximum value, setting the current maximum value to the second indicator of data integrity; and
    in response to determining the current maximum value satisfies a second threshold value, setting a size of a subsequent set of read operations to a third number of read operations, the third number being less than the second number.

8. A non-transitory computer-readable storage medium comprising instructions that, when executed by a processing device, cause the processing device to:
    receive a plurality of read operations directed to a portion of memory, the plurality of read operations divided into a current set of a sequence of read operations and one or more other sets of sequences of read operations, a size of the current set being a first number of read operations;
    select a first aggressor read operation from the current set;
    perform a first data integrity scan on a victim of the first aggressor read operation;
    determine a first indicator of data integrity based on the first data integrity scan;
    in response to determining the first indicator of data integrity is greater than a current maximum value of indicators of data integrity for a subdivision of memory, set the current maximum value to the first indicator of data integrity; and
    in response to determining the current maximum value satisfies a first threshold value, set a size of a subsequent set of read operations to a second number of read operations, the second number being less than the first number.

9. The non-transitory computer-readable storage medium of claim 8, wherein the first indicator of data integrity is a bit error rate.

10. The non-transitory computer-readable storage medium of claim 8, wherein the first indicator of data integrity is a read threshold voltage distribution.

11. The non-transitory computer-readable storage medium of claim 8, wherein the processing device is further to:
    select a second aggressor read operation from the subsequent set;
    perform a second data integrity scan on a victim of the second aggressor read operation from the subsequent set;
    determine a second indicator of data integrity based on the second data integrity scan; and
    in response to determining the second indicator of data integrity is greater than a second maximum value of indicators of data integrity for a subdivision of memory, set the second maximum value to the second indicator of data integrity.

12. The non-transitory computer-readable storage medium of claim 11, wherein the processing device is further to:
    in response to folding the victim of the first aggressor read operation, set the current maximum value to the second maximum value; and
    in response to determining the current maximum value no longer satisfies the first threshold value, set a size of a subsequent set of read operations to the first number of read operations.

13. The non-transitory computer-readable storage medium of claim 8, wherein the processing device is further to:
- select an aggressor read operation from the subsequent set of operations having a set size of the second number;
- perform a second data integrity scan on a victim of the aggressor read operation from the subsequent set of operations;
- determine a second indicator of data integrity based on the second data integrity scan;
- in response to determining the second indicator of data integrity is greater than the current maximum value, set the current maximum value to the second indicator of data integrity; and
- in response to determining the current maximum value satisfies a second threshold value, set a size of a subsequent set of read operations to a third number of read operations, the third number being less than the second number.

14. A system comprising:
- a plurality of memory devices; and
- a processing device, operatively coupled with the plurality of memory devices, to:
  - receive a plurality of read operations directed to a portion of memory, the plurality of read operations divided into a current set of a sequence of read operations and one or more other sets of sequences of read operations, a size of the current set being a first number of read operations;
  - select a first aggressor read operation from the current set;
  - perform a first data integrity scan on a victim of the first aggressor read operation;
  - determine a first indicator of data integrity based on the first data integrity scan;
  - in response to determining the first indicator of data integrity is greater than a current maximum value of indicators of data integrity for a subdivision of memory, set the current maximum value to the first indicator of data integrity; and
  - in response to determining the current maximum value satisfies a first threshold value, set a size of a subsequent set of read operations to a second number of read operations, the second number being different than the first number.

15. The system of claim 14, wherein the second number is less than the first number.

16. The system of claim 14, wherein the first indicator of data integrity is a bit error rate.

17. The system of claim 14, wherein the first indicator of data integrity is a read threshold voltage distribution.

18. The system of claim 14, wherein the processing device is further to:
- select a second aggressor read operation from the subsequent set;
- perform a second data integrity scan on a victim of the second aggressor read operation from the subsequent set;
- determine a second indicator of data integrity based on the second data integrity scan; and
- in response to determining the second indicator of data integrity is greater than a second maximum value of indicators of data integrity for a subdivision of memory, set the second maximum value to the second indicator of data integrity.

19. The system of claim 18, wherein the processing device is further to:
- in response to folding the victim of the first aggressor read operation, set the current maximum value to the second maximum value; and
- in response to determining the current maximum value no longer satisfies the first threshold value, set a size of a subsequent set of read operations to the first number of read operations.

20. The system of claim 14, wherein the processing device is further to:
- select an aggressor read operation from the subsequent set of operations having a set size of the second number;
- perform a second data integrity scan on a victim of the aggressor read operation from the subsequent set of operations;
- determine a second indicator of data integrity based on the second data integrity scan;
- in response to determining the second indicator of data integrity is greater than the current maximum value, set the current maximum value to the second indicator of data integrity; and
- in response to determining the current maximum value satisfies a second threshold value, set a size of a subsequent set of read operations to a third number of read operations, the third number being less than the second number.

* * * * *